(12) United States Patent
Racine

(10) Patent No.: US 10,367,049 B2
(45) Date of Patent: Jul. 30, 2019

(54) ELECTRO-OPTICAL ELEMENT INTEGRATING AN ORGANIC ELECTROLUMINESCENT DIODE AND AN ORGANIC TRANSISTOR FOR MODULATING SAID DIODE

(75) Inventor: Benoit Racine, Renage (FR)

(73) Assignee: INTERDIGITAL CE PATENT HOLDINGS, Paris (FR)

(*) Notice: Subject to any disclaimer, the term of this patent is extended or adjusted under 35 U.S.C. 154(b) by 3212 days.

(21) Appl. No.: 12/084,528

(22) PCT Filed: Oct. 26, 2006

(86) PCT No.: PCT/EP2006/067797
§ 371 (c)(1),
(2), (4) Date: Jan. 24, 2011

(87) PCT Pub. No.: WO2007/051753
PCT Pub. Date: May 10, 2007

(65) Prior Publication Data
US 2018/0158892 A1 Jun. 7, 2018

(30) Foreign Application Priority Data
Nov. 4, 2005 (FR) .................... 05 53348

(51) Int. Cl.
*H01L 27/32* (2006.01)
*H01L 51/05* (2006.01)
(Continued)

(52) U.S. Cl.
CPC ...... *H01L 27/3274* (2013.01); *H01L 27/3248* (2013.01); *H01L 51/0541* (2013.01);
(Continued)

(58) Field of Classification Search
CPC ............. H01L 51/0541; H01L 51/0545; H01L 51/0566; H01L 51/105; H01L 51/5012;
(Continued)

(56) References Cited

U.S. PATENT DOCUMENTS 5,093,698 A 3/1992 Egusa
5,107,308 A 4/1992 Koezuka et al.
(Continued)

FOREIGN PATENT DOCUMENTS

EP 0498979 8/1992
EP 1017118 7/2000
(Continued)

OTHER PUBLICATIONS

Li, Z. L. et al., "Patterning-Free Integration of Polymer Light-Emitting Diode and Polymer Transistor", Appl. Physics Letters, vol. 84, No. 18, May 3, 2004, pp. 3558-3560.
(Continued)

*Primary Examiner* — Mark W Tornow
(74) *Attorney, Agent, or Firm* — Brian J. Dorini; Patricia A. Verlangieri

(57) ABSTRACT

In this element, one of the current flow electrodes of the transistor and the lower electrode of the diode form a common layer. According to the invention, the transistor includes what is called a "contact" zone made of semiconductor material which is placed between at least one of its current flow electrodes and its active zone made of semiconductor material and which is doped with one or more dopants, which are electron donors or electron acceptors.

7 Claims, 2 Drawing Sheets

(51) Int. Cl.
*H01L 51/10* (2006.01)
*H01L 51/50* (2006.01)
*H01L 51/52* (2006.01)

(52) U.S. Cl.
CPC ........ H01L 51/0545 (2013.01); H01L 51/105 (2013.01); *H01L 51/0566* (2013.01); *H01L 51/5012* (2013.01); *H01L 51/5052* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5203* (2013.01); *H01L 51/5253* (2013.01); *H01L 51/5271* (2013.01)

(58) Field of Classification Search
CPC ............. H01L 51/5056; H01L 51/5072; H01L 51/5088; H01L 51/5092; H01L 51/5096; H01L 51/5203; H01L 51/5271; H01L 27/3274
See application file for complete search history.

(56) References Cited

U.S. PATENT DOCUMENTS

| | | | | |
|---|---|---|---|---|
| 5,970,318 | A | * | 10/1999 | Choi .................. H01L 27/3274 257/40 |
| 6,013,384 | A | | 1/2000 | Kido et al. |
| 6,150,668 | A | * | 11/2000 | Bao .................... H01L 27/3248 257/40 |
| 6,433,355 | B1 | | 8/2002 | Riess et al. |
| 6,639,281 | B2 | | 10/2003 | Kane et al. |
| 6,784,017 | B2 | | 8/2004 | Yang et al. |
| 2004/0004214 | A1 | * | 1/2004 | Yamazaki ........... H01L 51/5256 257/40 |
| 2004/0041146 | A1 | * | 3/2004 | Cheng ................. H01L 27/3274 257/40 |
| 2004/0062949 | A1 | | 4/2004 | Pfeiffer et al. |
| 2004/0119399 | A1 | | 6/2004 | Nagayama |
| 2006/0033115 | A1 | | 2/2006 | Blochwitz et al. |

FOREIGN PATENT DOCUMENTS

| | | |
|---|---|---|
| EP | 1076368 | 2/2001 |
| EP | 1414082 | 4/2004 |
| EP | 1439589 | 7/2004 |
| EP | 1443572 | 8/2004 |
| JP | 2003229616 | 8/2003 |
| WO | WO2003012980 | 2/2003 |
| WO | WO2003083958 | 10/2003 |

OTHER PUBLICATIONS

W.H. Kim et al.: "Molecular organic light-emitting diodes using highly conducting polymers as anodes" Applied Physics Letters, American Institute of Physics, vol. 80, No. 20, May 20, 2002, pp. 38844-3846.

K.L. Tzeng et al: "One-polymer active pixel", Applied Physics Letters, American Institute of Physics, vol. 84, No. 4, Jan. 26, 2004, pp. 619-621.

H. Sirringhaus et al.: "Integrated Optoelectronic Devices based on Conjugated Polymers", Science, American Association for the Advancement of Science, US, vol. 280, Jun. 12, 1998, pp. 1741-1744.

Search Report dated Jan. 12, 2007.

* cited by examiner

ELECTRO-OPTICAL ELEMENT INTEGRATING AN ORGANIC ELECTROLUMINESCENT DIODE AND AN ORGANIC TRANSISTOR FOR MODULATING SAID DIODE

This application claims the benefit, under 35 U.S.C. § 365 of International Application PCT/EP2006/067797, filed Oct. 26, 2006, which was published in accordance with PCT Article 21(2) on May 10, 2007 in French and which claims the benefit of French patent application No. 0553348, filed Nov. 4, 2005.

The invention relates to an electrooptic element integrating an organic light-emitting diode and an organic semiconductor modulation transistor for modulating this diode, which are bonded to one and the same substrate.

The modulation transistor includes an isolating dielectric layer interposed between, on one side, a control electrode, called "gate", and, on the other side, what is called an "active" zone of a layer of organic semiconductor material. This transistor also includes two approximately coplanar electrodes that are placed on either side of the active zone. When a potential difference is applied between these current electrodes, a current flows through the active zone between these electrodes, which current depends on the set voltage applied to the control electrode.

The diode comprises a plurality of stacked organic layers which are interposed between a lower electrode, which is common to one of the current flow electrodes of the transistor, and an upper electrode.

Document US 2004/041146 describes various possible structures of such integrated elements, in which in particular one of the current flow electrodes of the transistor is formed in the same lower layer as one of the electrodes of the diode (see reference 12 in the figures of that document). Moreover, the gate of the transistor may also be formed in the same upper layer as the other of the electrodes of the diode (see references 50 and 52 in the figures of that document, and paragraph 82). The transistors presented in that document are therefore of the "top gate" type.

The electrical contacts at the interfaces between the current flow electrodes and the active zone of the transistor are key factors that determine the performance of the transistor as are the electrical contacts at the interfaces between the electrodes and the active layer of the diode, that is to say the organic light-emitting layer. One object of the invention is to improve the contact at at least one of these interfaces, both in the transistor and in the diode, using one and the same layer of suitable semiconductor material, which is suitably doped in the appropriate zones of this layer. One improvement of the invention consists in using this layer as electrode for the diode.

Moreover, the "top gate" structure of the elements presented in document US 2004/041146 has a drawback when these elements are integrated into a diode panel, especially for image display. This is because in general, in such a panel, the upper electrode of the diodes is then generally common to all the diodes and in general forms a uniform hole-free layer that protects the underlying organic layers. This common electrode therefore participates in encapsulating the diodes. It is therefore impossible in this case for the gate electrodes of the transistors and the upper electrode common to all the diodes to be produced in the same layer.

One object of the invention, when it relates to image display panels is to alleviate this drawback by proposing, in particular, electrooptic elements in which the transistors are bottom-gate transistors.

Thus, one subject of the invention is an electrooptic element comprising an organic light-emitting diode and an organic semiconductor modulation transistor for modulating this diode which are bonded to one and the same substrate,
  said modulation transistor comprising an isolating dielectric layer interposed between, on one side, a control electrode called "gate" and, on the other side, what is called an "active" zone of a layer of organic semiconductor material, which zone also lies between two approximately coplanar electrodes for the flow of the current through said active zone;
  said diode comprising a plurality of stacked organic layers which are interposed between a lower electrode, which is common to one of the current flow electrodes of the transistor, and an upper electrode, . . . in which said transistor includes what is called a "contact" zone made of semiconductor material, which is placed between at least one of said current flow electrodes of said active zone; this semiconductor material is doped with one or more dopants, which are either electron donors or electron acceptors, at least at the interface between at least one current flow electrode and said active zone, the doping at said interface preferably being designed to obtain an ohmic-type or Schottky-type contact when a current flows through said diode and said transistor.

According to a first embodiment, the same semiconductor material, which is doped, forms both the at least one contact zone of the transistor and also a layer for injecting and transporting charges—electrons or holes—which is in contact with said lower electrode of the diode and is interposed between the two electrodes of the diode.

According to a second embodiment, the doped semiconductor material forms said electrode common to the transistor and, consequently, also forms said contact zone between one of said current flow electrodes and said active zone of the transistor.

Preferably, the semiconductor material of the charge injection/transport layer is an organic material.

The gate may be in a bottom position i.e. a bottom gate, or in a top position i.e. a top gate, relative to the active zone of the transistor.

The diode and the transistor therefore have one electrode in common, as described in document US 2004/041146.

The doped semiconductor material in the contact zone is intended to improve the transfer of carriers electrons or holes—between the common electrode and the active zone of the transistor. Such a mechanism for improving the contact is described for example in document U.S. Pat. No. 6,784,017 in which the dopant is provided at the interface by thermal diffusion from the electrode. Document EP 1 414 082 also describes the insertion of a doped organic layer between one of the electrodes of a transistor and its organic active zone, so as to improve the charge injection into the active zone. However, neither document U.S. Pat. No. 6,784,017 nor document EP 1 414 082 suggests the use of the same semiconductor layer both for improving the charge injection into the active zone of the transistor and for either improving the charge injection into the active zone of the diode or for serving as electrode for this diode. It should be noted that the use of one and the same layer for two functions simplifies the fabrication of the electrooptic element and that neither of the abovementioned documents teaches this means of simplifying the fabrication.

According to the first embodiment the contact zone of the transistor and the organic charge injection/transport layer of the diode are formed in one and the same layer, during one and the same operation of fabricating the electrooptic element: thus, the fabrication of the element is advantageously simplified. In this case the two current flow electrodes of the transistor and the lower electrode of the diode may be made of a metallic material. According to the invention, the same doped semiconductor material serves to improve, on the one hand, the contacts between the current flow electrodes and the active zone of the transistor and, on the other hand, the injection of charges into the diode and their transport therein. The doping is tailored on the one hand to the function of injecting charges into the contact zone of the transistor and on the other hand to the function of injecting charges into the diode. The nature and the concentration of the dopants may therefore vary depending on the layer zone in question, namely the zone in the transistor or the zone in the diode. The light-emitting diodes having such injection/transport layers made of n-doped or p-doped semiconductor material are for example described in documents EP 0 498 979, U.S. Pat. Nos. 5,093,698, 6,013,384, EP 1 017 118, US 2004/062949, WO 03/083958 and WO 03/012980. The organic transistors having such charge injection layers are described for example in documents EP 1 414 082 and U.S. Pat. No. 5,107,308. The doped semiconductor material, the nature of the dopants and the level of doping therefore form part of the general knowledge of a person skilled in the art, and will therefore not be described here in detail.

It should be pointed out that, in the electrooptic element shown in FIGS. 3a, 3b, 4a to 4c of document US 2004/041146 mentioned above, the same semiconductor material was used for the active zone ("OAL") of the transistor and for the organic hole injection/transport layer of the diode ("HTL"), something which would not be possible in the case of the invention since the doped semiconductor material serving for charge transport in the case of the invention is too highly doped and conductive to serve as active zone material.

According to the second embodiment, the contact zone of the transistor and the common electrode are formed in the same layer, during one and the same operation of fabricating the electrooptic element. Thus, the fabrication of the element is advantageously simplified.

In this embodiment, differing from the previous one, the doped semiconductor material of the contact zone of the transistor serves itself as material for one of the electrodes, either the upper or lower one, of the diode. This is possible because such a material is sufficiently conductive, unlike the materials used for the hole injection/transport layer described in document US 2004/041146 already mentioned. Moreover, it should be noted that document U.S. Pat. No. 6,433,355 illustrates light-emitting diodes in which at least one of the electrodes is made of a semiconductor material.

Preferably, the plurality of organic layers of the diode includes at least one organic layer for blocking charges (electrons or holes), and the blocking layer of the diode and the active zone of the transistor are formed by one and the same organic semiconductor material. The active zone of the transistor and this organic blocking layer of the diode are preferably formed in the same layer, during one and the same operation of fabricating the electrooptic element. Thus, the fabrication of the electrooptic element is advantageously simplified. Document EP 1 017 118 already mentioned describes diodes provided with such blocking layers, which use, in particular, an undoped or lightly doped semiconductor, which may therefore be perfectly suitable, according to the invention, for the active zone of the transistor.

Preferably, the diode includes a transparent dielectric layer which is in contact with one of its electrodes but is not interposed between its electrodes, and the transparent dielectric layer of the diode and the isolating dielectric layer of the transistor are formed by the same material.

The isolating dielectric layer of the transistor and the transparent dielectric layer of the diode are preferably formed in the same layer, during one and the same operation of fabricating the electrooptic element. Thus, the fabrication of the electrooptic element is advantageously simplified. Of course, it is on that side via which the light emitted leaves the diode that this transparent dielectric layer is placed. It is not interposed between the electrodes, because it is insulating and would prevent currents from flowing into the diode. Advantageously, this dielectric layer contributes to the encapsulation of the diode, that is to say the protection of the organic layers against degradation by contaminants. Preferably, the material of this dielectric layer and its thickness are designed so as to give the electrode/dielectric assembly maximum transmitivity, as illustrated for example in documents EP 1 076 368, EP 1 439 589 (see FIG. 4d) and EP 1 443 572, in which the upper dielectric layer (reference 22, made of ZnS: 20% $SiO_2$ material) has the function of reducing the absorption of the light emitted through the transparent upper electrode (including the metallic silver layer, referenced 16T).

Preferably:
said control electrode of the transistor is in a bottom position, i.e. interposed between said substrate and said isolating dielectric layer;
said diode includes a reflecting layer interposed between said substrate and said isolating dielectric layer; and
said reflecting layer and said control electrode are formed by the same material.

It is therefore possible, in a single deposition operation, to produce this layer and this electrode, thereby simplifying the fabrication of the element.

Another subject of the invention is an image display panel comprising an array of electrooptic elements according to the invention, in which the electrooptic elements are supported by the same substrate.

Preferably, the control electrodes of the transistors of the electrooptic elements are in a bottom position, i.e. interposed between said substrate and said isolating dielectric layer. The transistors are therefore said to be bottom-gate transistors.

Preferably, the upper electrode of the diodes of the electrooptic elements is common to all the diodes. Such a common electrode is possible because the transistors are bottom-gate transistors. Therefore the fabrication of the panel is advantageously simplified and its encapsulation is advantageously improved.

The invention will be more clearly understood on reading the following description, given by way of nonlimiting example and with reference to the appended figures in which.

Figure 1:
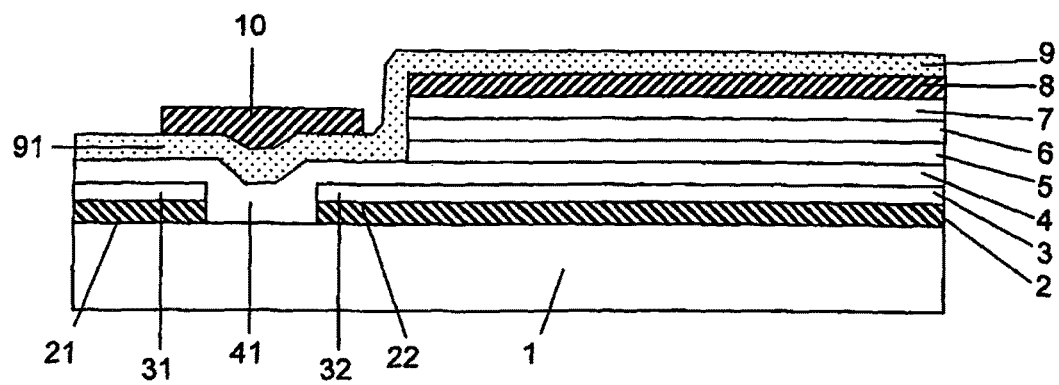
FIG. 1 illustrates a first embodiment of the invention in which the transistor is a top-gate transistor.

To simplify the description and bring out the differences and advantages afforded by the invention compared with the prior art, identical or similar references will be used for the elements that provide the same functions.

An electooptic element according to a first embodiment of the invention will now be described with reference to FIG. 1.

Deposited on an insulating substrate 1 are a lower conducting layer 2 and a layer 3 made of highly n-doped semiconductor material. As material for the lower conducting layer, aluminum or silver may for example be chosen. As highly n-doped semiconductor material, $n^+$ amorphous silicon may for example be chosen. Next, a gap is made in these two layers, so as to provide the place for the active zone of the transistor and to isolate the two current flow electrodes 21 and 22, called drain and source, of the transistor, and the contact zones 31, 32 of these electrodes.

Next, a layer 4 of organic semiconductor material capable of both blocking the holes in the diode and serving as active zone 41 of the transistor is applied.

Next, in the emissive zone of the diode, an organic electroluminescent layer 5, an electron blocking layer 6, a hole injection/transport layer 7 and the upper electrode of the diode 8, respectively, are applied.

Next, applied over the entire surface of the element is an isolating transparent dielectric layer 9 capable of acting as insulator for the transistor and of effectively protecting the organic layers of the diodes from the risk of being degraded by the oxygen or water vapor in the atmosphere. A conducting layer is then applied on top of the active zone of the transistor, said layer serving as gate electrode 10 for this transistor.

What is thus obtained is an electrooptic element according to the invention in which the same layer 2 serves as current flow electrodes for the transistor and as lower electrode for the diode, in which the same layer 3 serves to improve the electrical contacts of the current flow electrodes of the transistor and to inject electrons into the diode and transport them therein, in which the same layer 4 serves for the active zone of the transistor and for blocking the holes in the diode, and in which the same layer 9 serves as gate insulation layer for the transistor and as encapsulation layer for the diode. Thanks to this large number of layers shared between the transistor and the diode, the fabrication of the electrooptic element is considerably simplified, whilst still improving its operation, in particular at the electrical contacts between current flow electrodes of the transistor and the organic active zone of this transistor.

Figure 2:
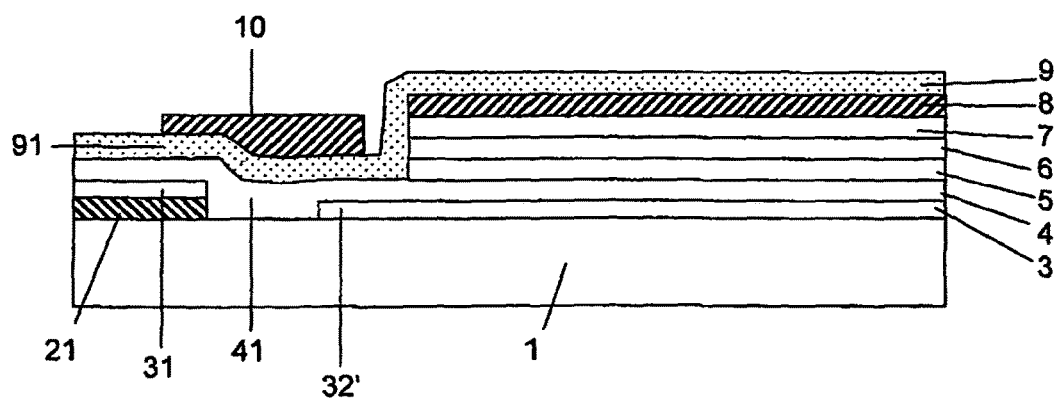
FIG. 2 illustrates a variant of the embodiment shown in FIG. 1.

FIG. 2 show an advantageous variant of the embodiment of FIG. 1. The only difference is that the lower electrode of the diode of the electrooptic element according to this variant is formed here directly by the layer of doped semiconductor material, without a conducting subjacent layer. This variant is advantageous in particular in the case of bottom-emitting diodes, in which the light emitted passes through the substrate, since a layer liable to absorb the emitted light has been omitted.

Figure 3:
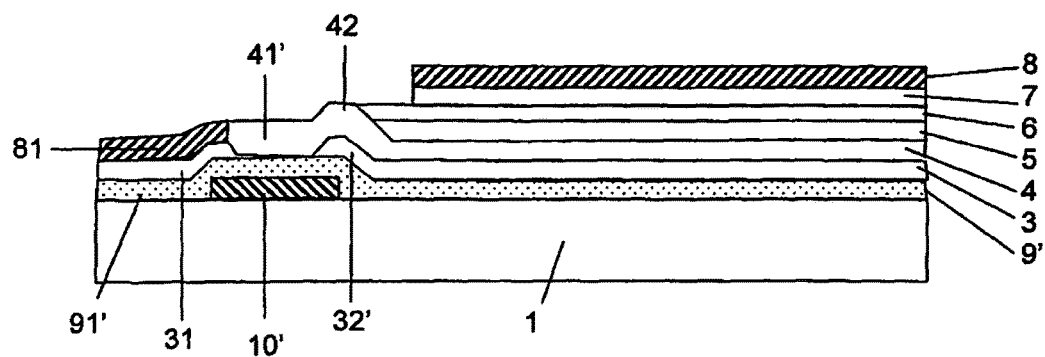
FIG. 3 illustrates a second embodiment of the invention, in which the transistor is a bottom-gate transistor.

An electrooptic element according to a second embodiment of the invention will now be described with reference to FIG. 3.

Deposited on an insulating substrate 1 are conducting patterns forming gate electrodes 10', followed by an isolating transparent dielectric layer 9' covering the entire useful zone of the substrate. As dielectric material, silicon nitride may for example be chosen. Deposited on this dielectric layer is a layer 3' of highly n-doped semiconductor material. As highly n-doped semiconductor material, $n^+$ amorphous silicon may for example be chosen. Next, a gap is made in the latter layer, in order to provide the place for the active zone of the transistor and to separate a contact zone 31' of one current flow electrode from the other current flow electrode 32' of the transistor.

Next, a layer 4 of organic semiconductor material capable of both blocking the holes in the diode and serving for the active zone 41' of the transistor is applied.

Next, an organic electroluminescent layer 5, an electron blocking layer 6 and a hole injection/transport layer 7, respectively, are applied in the emissive zone of the diode. Advantageously, the boss 42 in the hole blocking layer 4 serves as a separator, in particular for the organic electroluminescent layer 5, thereby preventing colors from mixing when an image display panel formed from the electrooptic elements according to the invention is fabricated.

Next, a conducting layer 8 is applied which will serve both as upper electrode for the diode and as current flow electrode 81 for the transistor. The insulation between these electrodes may be provided at the time of the deposition, for example using an appropriate shadow mask.

Thus, an electrooptic element according to the invention is obtained in which the same layer 3 serves for improving the electrical contact of a current flow electrode of the transistor and for injecting electrons into the diode and for transporting them therein, in which the same layer 4 serves for the active zone of the transistor and for blocking the holes in the diode, and in which the same layer 8 serves both as upper electrode for the diode and as current flow electrode for the transistor. Thanks to this very large number of layers shared between the transistor and the diode, the fabrication of the electrooptic element is considerably simplified, while still improving its operation.

The present invention has been described with reference to an electrooptic element in which the diode has what is called an inverted structure, that is to say one in which the lower electrode serves as cathode. The invention applies in the same way to an electrooptic element in which the diode has a conventional structure, i.e. one in which the lower electrode serves as anode. The doped semiconductor that serves both for blocking the electrons and for improving the contacts may then be made of p-doped micro-crystalline silicon. The invention also applies to electrooptic elements in which the diodes have a smaller number of organic layers, for example in which the charge injection/transport layer 7 which is in contact with the upper electrode serves also as electroluminescent layer or for blocking opposite charges. The invention also applies to electrooptic elements in which the transistors comprise several source electrodes and several drain electrodes, as described for example in FIG. 4 of document U.S. Pat. No. 6,639,281.

The invention also applies to image display panels provided with electrooptic elements according to the invention.

It is obvious to a person skilled in the art that the invention may apply to other types of electrooptic elements and to other types of display panels without departing from the scope of the following claims.

The invention claimed is:

1. An electrooptic element having an organic light-emitting diode and an organic semiconductor modulation transistor for modulating the organic light emitting diode (OLED), said OLED and said organic semiconductor modulation transistor being bonded to one and the same substrate,
said modulation transistor comprising:
 a gate electrode disposed on the substrate;
 a transparent isolating layer disposed over the gate electrode and the entire substrate;
 a gap formed in a doped semiconductor material layer disposed over said transparent isolating layer, said gap forming an active zone; and
 a layer of organic semiconductor material positioned over the doped semiconductor material layer and filling the gap to form the active zone, said layer of organic semiconductor material having a boss configured to separate an EL layer of the OLED to prevent colors from mixing during fabrication of an image display panel using the electrooptic elements.

2. The electrooptic element of claim 1, wherein said OLED comprises:
- a doped semiconductor material disposed on said substrate, said doped semiconductor material forming a lower electrode of the OLED;
- an organic semiconductor material disposed on said doped semiconductor material;
- one or more additional layers disposed on said organic semiconductor material; and
- an upper conductor disposed on said one or more layers.

3. The electrooptic element of claim 2, where in the one or more additional layers comprise:
- an organic electroluminescent layer disposed on said organic semiconductor material;
- an electron blocking layer disposed on said electroluminescent layer; and
- a layer for injecting and transporting charges disposed on the electron blocking layer, said upper conductor being disposed on said layer for injecting and transporting charges.

4. The electrooptic element of claim 2, wherein said modulation transistor further comprises:
- an isolating dielectric layer disposed on the layer of organic semiconductor material in an area around the active zone and the upper conductor in the OLED; and
- a control electrode positioned above the isolating dielectric layer in the active zone.

5. The electrooptic element as claimed in claim 3, wherein, the electron blocking layer of said OLED and said active zone of the modulation transistor are formed by one and the same organic semiconductor material.

6. The electrooptic element as claimed in claim 4, wherein said isolating dielectric layer comprises a transparent dielectric layer, and wherein said transparent dielectric layer of the OLED and said isolating dielectric layer of the modulation transistor are formed of the same material.

7. An image display panel comprising an array of electrooptic elements as claimed in claim 1, wherein said electrooptic elements are supported by the same substrate.

* * * * *